(12) United States Patent
Kimball et al.

(10) Patent No.: US 8,906,164 B2
(45) Date of Patent: Dec. 9, 2014

(54) METHODS FOR STABILIZING CONTACT SURFACES OF ELECTROSTATIC CHUCKS

(75) Inventors: Chris Kimball, San Jose, CA (US); Tom Stevenson, Morgan Hill, CA (US); Peter Muraoka, San Mateo, CA (US)

(73) Assignee: Lam Research Corporation, Fremont, CA (US)

(*) Notice: Subject to any disclaimer, the term of this patent is extended or adjusted under 35 U.S.C. 154(b) by 679 days.

(21) Appl. No.: 12/850,938

(22) Filed: Aug. 5, 2010

(65) Prior Publication Data

US 2012/0031427 A1 Feb. 9, 2012

(51) Int. Cl.
*B08B 7/00* (2006.01)
*B08B 1/00* (2006.01)
*H01L 21/683* (2006.01)

(52) U.S. Cl.
CPC ............ *B08B 7/0064* (2013.01); *B08B 1/00* (2013.01); *H01L 21/6831* (2013.01)
USPC .............................. 134/1.3; 134/1.2; 361/234

(58) Field of Classification Search
USPC ..................... 134/1.2, 1.3; 361/234
See application file for complete search history.

(56) References Cited

U.S. PATENT DOCUMENTS

| | | | |
|---|---|---|---|
| 5,215,619 A | 6/1993 | Cheng et al. | |
| 5,583,736 A | 12/1996 | Anderson et al. | |
| 5,620,526 A | 4/1997 | Watatani et al. | |
| 5,715,132 A | 2/1998 | Steger et al. | |
| 5,729,423 A | 3/1998 | Donde et al. | |
| 6,325,948 B1 | 12/2001 | Chen et al. | |
| 6,606,234 B1 | 8/2003 | Divakar | |
| 6,774,045 B1 * | 8/2004 | Liu et al. | 438/709 |
| 7,028,696 B2 | 4/2006 | Richardson et al. | |
| 7,196,896 B2 | 3/2007 | Howald et al. | |
| 7,578,301 B2 | 8/2009 | Hudson et al. | |
| 2001/0003676 A1 * | 6/2001 | Marks et al. | 438/710 |
| 2002/0074014 A1 * | 6/2002 | Yeh et al. | 134/1.1 |
| 2002/0171994 A1 | 11/2002 | Grimard et al. | |
| 2003/0183335 A1 * | 10/2003 | Winniczek et al. | 156/345.1 |
| 2005/0205417 A1 | 9/2005 | Chang et al. | |
| 2006/0051966 A1 * | 3/2006 | Or et al. | 438/706 |
| 2007/0030621 A1 * | 2/2007 | Gaff et al. | 361/234 |
| 2010/0154996 A1 * | 6/2010 | Hudson et al. | 156/345.35 |

OTHER PUBLICATIONS

International Preliminary Report on Patentability for Application No. PCT/IB/2011/053417 mailed Feb. 5, 2013.

* cited by examiner

*Primary Examiner* — Michael Kornakov
*Assistant Examiner* — Katelyn Whatley

(57) ABSTRACT

Methods for stabilizing a ceramic contact surface of an electrostatic chuck, wherein the electrostatic chuck can be disposed within a reaction chamber of a semiconductor wafer processing assembly including a radio frequency source and a coolant gas supply are described herein. The method may include: clamping electrostatically a conditioning wafer to the ceramic contact surface of the electrostatic chuck; and cycling an output power of the radio frequency source and an output pressure of the coolant gas supply for multiple hot/cold cycles. Each of the hot/cold cycles includes a hot abrasion state and a cold abrasion state. At the hot abrasion state, the output power of the radio frequency source is relatively high and the output pressure of the coolant gas supply is relatively low to yield a relatively hot conditioning wafer. At the cold abrasion state, the output power of the radio frequency source is relatively low and the output pressure of the coolant gas supply is relatively high to yield a relatively cool conditioning wafer.

17 Claims, 1 Drawing Sheet

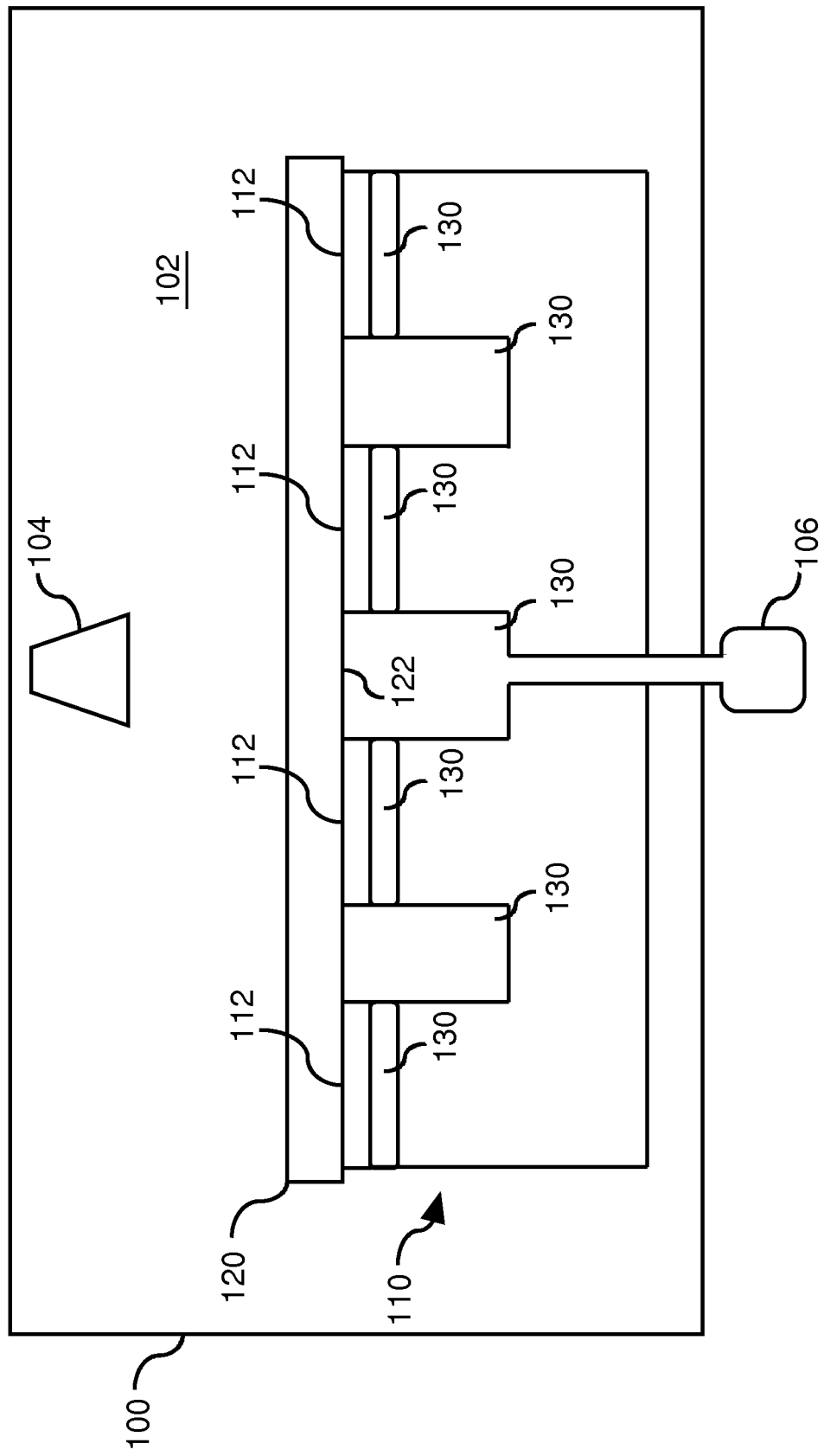

METHODS FOR STABILIZING CONTACT SURFACES OF ELECTROSTATIC CHUCKS

BACKGROUND

The present disclosure relates generally to electrostatic chucks and, more particularly, to methods for stabilizing a micro-topography of a ceramic contact surface of an electrostatic chuck.

SUMMARY

A waferless auto clean (WAC) is a process that may be utilized to clean an electrostatic chuck disposed within a reaction chamber of a semiconductor wafer processing assembly. A WAC is commonly employed periodically during production to remove byproducts that deposit on surfaces within the reaction chamber and to prevent contamination of production wafers. For example, as is well documented in the art, the radial density of the reaction chamber is commonly raised for chemical cleaning while the ion energy is commonly kept high enough to remove byproducts from the electrostatic chuck surfaces and low enough to prevent sputtering on the electrostatic chuck surfaces. More specifically, a WAC can be run after each production wafer has been manufactured for a duration of about 15 seconds to about 60 seconds. The duration is commonly based upon the optical emissions of a fluorine signal (commonly with about 50% to about 100% margin added beyond what is required for optical endpoint). Oxygen can be introduced into the reaction chamber at high flow rate, such as, for example, about 2000 sccm of $O_2$. Other gases such as $CF_4$ or $Cl_2$ may be added. The internal pressure can be relatively high such as, but not limited to, greater than 300 mT or from about 500 mT to about 600 mT. Output power may be generated from a single radio frequency (RF) source at a power level from about 500 W to about 750 W at a frequency of about 27 MHZ to about 60 MHz. A second RF source may be utilized to deliver an additional output power such as, for example, from about 50 W to about 150 W at a frequency of about 2 MHz.

As will be appreciated by those practicing the present invention, the concepts of the present disclosure are applicable to a wide variety of WAC's, but not limited to, those illustrated in U.S. Pat. Nos. 5,620,526, 6,325,948, 7,028,696, 7,578,301, and others. The concepts of the present disclosure have been illustrated with reference to relatively simple WAC's for clarity but the scope of the present disclosure should not be limited to these relatively simple WAC's.

Electrostatic chucks can be used to fix, clamp or otherwise handle a wafer for semiconductor processing. Many electrostatic chucks are also configured to help regulate the temperature of the wafer during processing. For example, as is well documented in the art, a high thermal conductivity gas such as helium gas can circulated in an electrostatic chuck to help regulate the temperature of the wafer. More specifically, a relatively thin layer of gas at relatively low pressure can be used to sink heat from a wafer during plasma-etch fabrication or other semiconductor processing steps. The pressure of the gas, which typically exerts only a few pounds of force on the wafer, permits the use of electrostatic attraction to oppose it and seal the wafer to a face of the chuck.

As will be appreciated by those practicing the present invention, the concepts of the present disclosure are applicable to a wide variety of electrostatic chuck configurations that would otherwise be prone to unstable micro-topography of a ceramic contact surface including, but not limited to, those illustrated in U.S. Pat. Nos. 5,583,736, 5,715,132, 5,729,423, 6,606,234, and others. The concepts of the present disclosure have been illustrated with reference to the relatively simple chuck configuration of FIG. 1 for clarity but the scope of the present disclosure should not be limited to the relatively simple configuration.

In accordance with one embodiment of the present disclosure, a method for stabilizing a ceramic contact surface of an electrostatic chuck, wherein the electrostatic chuck can be disposed within a reaction chamber of a semiconductor wafer processing assembly including a radio frequency source and a coolant gas supply may include: clamping electrostatically a conditioning wafer to the ceramic contact surface of the electrostatic chuck; and cycling an output power of the radio frequency source and an output pressure of the coolant gas supply for multiple hot/cold cycles. Each of the hot/cold cycles includes a hot abrasion state and a cold abrasion state. At the hot abrasion state, the output power of the radio frequency source is relatively high and the output pressure of the coolant gas supply is relatively low to yield a relatively hot conditioning wafer. At the cold abrasion state, the output power of the radio frequency source is relatively low and the output pressure of the coolant gas supply is relatively high to yield a relatively cool conditioning wafer.

Additional embodiments of broader and narrower scope are contemplated.

BRIEF DESCRIPTION OF THE SEVERAL VIEWS OF THE DRAWINGS

The following detailed description of specific embodiments can be best understood when read in conjunction with the following drawings, where like structure is indicated with like reference numerals and in which:

FIG. 1 is a schematic illustration of an electrostatic chuck disposed within a chamber of a semiconductor wafer processing assembly according to embodiments of the present disclosure where a conditioning wafer is electrostatically clamped to a surface of the electrostatic chuck.

DETAILED DESCRIPTION

The various aspects of the present invention can be illustrated in the context of a non-specific semiconductor wafer processing assembly 100, which is merely illustrated schematically in FIG. 1 to avoid limitation of the concepts of the present invention to particular semiconductor wafer processing configurations, or components that may not be integral to the subject matter of the present invention. As is generally illustrated in FIG. 1, a semiconductor wafer processing assembly 100 comprises a reaction chamber 102, a radio frequency source 104, and a coolant gas supply 106. An electrostatic chuck 110 is disposed within the reaction chamber 102 to secure a conditioning wafer 120 for processing and comprises a ceramic contact surface 112. The semiconductor wafer processing assembly 100 is described herein as being non-specific because it is contemplated that the concepts of the present disclosure will be applicable to a variety of types of semiconductor wafer processing assemblies and should not be limited to processing assemblies similar to that illustrated generally in FIG. 1.

The micro-topography of a ceramic contact surface 112 of an electrostatic chuck 110 is stabilized by cycling a conditioning wafer 120 that is electrostatically clamped to the ceramic contact surface 112. The output power of the radio frequency source 104 and the output pressure of the coolant gas supply 106 are cycled for multiple hot/cold cycles. Each of the hot/cold cycles includes a hot abrasion state and a cold abrasion state. When in the hot abrasion state, the output power of the radio frequency source 104 is relatively high and the output pressure of the coolant gas supply 106 is relatively low. As a result, the conditioning wafer 120 is heated, which yields a relatively hot conditioning wafer. When in the cold abrasion state, the output power of the radio frequency source 104 is relatively low and the output pressure of the coolant gas supply 106 is relatively high, which yields a relatively cool conditioning wafer. Therefore, in each of the hot/cold cycles the conditioning wafer 120 is heated and cooled once per cycle. Since the conditioning wafer 120 is subjected to alternating heating and cooling, the conditioning wafer 120 expands and contracts causing surface abrasion between the back side 122 of the conditioning wafer 120 and the ceramic contact surface 112. The embodiments described herein may be applied to an electrostatic chuck 110 that is in a newly-manufactured state or is in a production state, i.e. the electrostatic chuck 110 may be periodically processed, as described herein, to achieve the desired micro-topography of the ceramic contact surface 112 after the electrostatic chuck 110 has been utilized in a manufacturing process.

For the purposes of describing and defining the present invention, it is noted that "micro-topography" refers to the microscale roughness or smoothness of a surface. Furthermore, as used herein, the term "conditioning wafer" means a wafer that mimics the material properties of a production semiconductor wafer. The conditioning wafer 120 may comprise any material such as silicon, any other semiconductor, or any metallic alloy. Additionally, the conditioning wafer 120 may comprise a deposited coating or a thermal oxidation coating such as, for example, silicon nitride, a thermal oxide, or any other coating that is relatively hard in comparison to the conditioning wafer material. It is further noted that the term "gas supply" means a source that provides gas at a controllable pressure to a wafer processing assembly such as a piped gas system, a pressurized vessel, and their equivalents.

In one embodiment, a steady state wafer temperature is provided by, for example, data from a semiconductor wafer manufacturing process. Specifically, a manufacturer may record temperature data from production electrostatic chucks subjected to a specific recipe procedure. Based on such data, a desired production temperature may be established. For example, after a newly manufactured electrostatic chuck is installed in a semiconductor wafer processing assembly 100 the micro-topography changes during an initial period of use. Heat transfer characteristics of the newly manufactured electrostatic chuck also change with the micro-topography. Commonly, such heat transfer characteristics exhibit substantially stable performance for a relatively long period of time, as compared to the initial period of use, after the initial period of use. Additionally, it is noted that the production of a semiconductor device may require a specific recipe procedure. Each recipe procedure involves an alteration of parameters within a reaction chamber such as gas mixture, chamber pressure, output power levels, and the like. Since each recipe procedure is readily duplicated when the parameters are known, those skilled in the art may readily employ the embodiments described herein when provided with the recipe procedure by a semiconductor manufacturer.

Methods for stabilizing the micro-topography of the ceramic contact surface 112 of an electrostatic chuck 110 may include removing the conditioning wafer 120 from the ceramic contact surface 112 of the electrostatic chuck 110. After electrostatically clamping an instrumented wafer to the ceramic contact surface 112 of the electrostatic chuck 110, a seasoning temperature of the electrostatic chuck 110 may be measured with the instrumented wafer. Examples of instrumented wafers include in-situ plasma etch wafer temperature measurement products such as the ETCHTEMP wafer by KLA-Tencor of Milpitas, Calif. As will be described in greater detail herein, the steady state wafer temperature may be compared to the seasoning temperature of the electrostatic chuck 110 to establish a temperature delta.

In one embodiment, the electrostatic chuck 110 is in a newly-manufactured state prior to the initial electrostatic clamping of the conditioning wafer to the ceramic contact surface of the electrostatic chuck. The seasoning temperature of the electrostatic chuck 110 is then measured with the instrumented wafer after about 150 to about 1,000 hot/cold cycles of the output power of the radio frequency source and the output pressure of the coolant gas supply. The precise number of hot/cold cycles that are performed prior to the initial measurement is dependent upon the repeatability of the electrostatic chuck manufacturing process. For example, one known process consistently yields electrostatic chucks that typically require between about 300 to about 400 hot/cold cycles to achieve a steady state condition, as will be described in greater detail herein.

In another embodiment, the temperature delta is correlated to the micro-topography of the ceramic contact surface 112 of the electrostatic chuck 110. The micro-topography of the ceramic contact surface 112 is at a steady state condition, i.e. a micro-topography corresponding to substantially stable heat transfer performance, when the seasoning temperature of the electrostatic chuck 110 is about the same as the steady state wafer temperature, i.e. when the temperature delta is about zero. The micro-topography of the ceramic contact surface 112 is relatively rough compared to the steady state condition when the seasoning temperature of the electrostatic chuck 110 is greater than the steady state wafer temperature. The micro-topography of the ceramic contact surface 112 is relatively smooth compared to the steady state condition when the steady state wafer temperature is greater than the seasoning temperature of the electrostatic chuck 110.

In further embodiments, the seasoning temperature of the electrostatic chuck 110 is measured with the instrumented wafer during the recipe procedure, e.g., the recipe procedure is applied to the instrumented wafer by duplicating the parameters of the recipe procedure in the reaction chamber 102 while measuring the seasoning temperature. Additionally, in order to achieve the desired micro-topography of the ceramic contact surface 112 a number of iterations of hot/cold cycling and seasoning temperature measurement may be required, as described hereinabove. For example, the seasoning temperature may be measured every about 100 to about 200 hot/cold cycles of the output power of the radio frequency source 104 and the output pressure of the coolant gas supply 106 until the desired micro-topography of the ceramic contact surface 112 is achieved.

Methods for stabilizing the micro-topography of the ceramic contact surface 112 of an electrostatic chuck 110 may further include removing the conditioning wafer from the ceramic contact surface of the electrostatic chuck, and processing the electrostatic chuck with a waferless auto clean (WAC), as described herein. Subjecting the electrostatic chuck 110 to WAC may roughen the micro-topography of the ceramic contact surface 112, i.e. alter the heat transfer characteristics of the electrostatic chuck 110.

In one embodiment, a baseline yield rate is provided. The baseline yield rate may correspond to the observed yield of a semiconductor manufacturing process over an extended period of time. Information indicative of the micro-topography of the ceramic contact surface 112 of the electrostatic chuck 110 may be provided by tracking the actual yield, or yield over a short period of time relative to the extended period of time, of the semiconductor-manufacturing process and comparing it with the baseline yield rate. When the actual yield of the semiconductor-manufacturing process is less than the baseline yield rate, the micro-topography of the ceramic contact surface 112 of the electrostatic chuck 110 is commonly relatively smooth as compared with the steady state condition. More specifically, the drop in yield typically corresponds to a temperature drift condition, e.g., drop in wafer temperature, which results in a decrease in the efficiency of the manufacturing process. Therefore, in order to improve the micro-topography of the ceramic contact surface 112 the WAC may be set relatively aggressive compared to a recipe WAC, as will be described in greater detail herein. For the purposes of describing and defining the present invention, it is noted that "recipe WAC" refers to the WAC procedure used by a manufacturer under normal manufacturing conditions.

In the embodiments described herein, the coolant gas supply 106 may supply a thermally conductive gas 130 such as, for example, helium that is sealed between a back side 122 of the conditioning wafer 120 and the ceramic contact surface 112 of the electrostatic chuck 110. A maximum acceptable seepage-flow rate may be provided by a process control or recipe procedure. The leakage rate of the thermally conductive gas 130 from between the back side 122 of the conditioning wafer 120 and the ceramic contact surface 112 of the electrostatic chuck 110 may be measured by instrumentation such as a flow meter and the like. Information indicative of the micro-topography of the ceramic contact surface 112 of the electrostatic chuck 110 may be provided by comparing the leakage rate to the maximum acceptable seepage-flow rate. More specifically, a leakage rate that is greater than the maximum acceptable seepage-flow rate typically corresponds to a micro-topography that is relatively rough as compared with the steady state condition. Therefore, in order to improve the micro-topography of the ceramic contact surface 112 the WAC is relatively mild compared to the recipe WAC.

The WAC is relatively aggressive when the ion energy of the reaction chamber 102 is relatively high compared to the recipe ion energy, the ion flux of the reaction chamber 102 is relatively high compared to the recipe ion flux, the amount of reactive species such as, for example fluorine or chlorine is relatively high compared to the recipe amount of reactive species, or a combination thereof. The WAC is relatively mild when the ion energy of the reaction chamber 102 is relatively low compared to the recipe ion energy, the ion flux of the reaction chamber 102 is relatively low compared to the recipe ion flux, the amount of reactive species is relatively low compared to the recipe amount of reactive species, or a combination thereof. For example, the ion energy may be increased by increasing the output power of the radio frequency source 104, lowering the pressure of the reaction chamber 102, lowering the frequency of the output power of the radio frequency source 104, or combinations thereof. Additionally, the ion flux may be increased by adding more output frequencies from the radio frequency source 104.

In one embodiment, the WAC is about 90 seconds in duration for each of the hot/cold cycles of the output power of the radio frequency source 104 and the output pressure of the coolant gas supply 106. For example, if there are 100 hot/cold cycles, the WAC is about 9,000 seconds in duration. It is noted that the hot/cold cycles may all be performed prior to or after performing the WAC. In another embodiment the hot/cold cycling may be mixed with a portion of the WAC, e.g., perform half of the hot/cold cycles, then half of the WAC, then the other half of the hot/cold cycles, then the other half of the WAC. In a further embodiment, the total duration of the WAC and all of the hot/cold cycles of the output power of the radio frequency source 104 and the output pressure of the coolant gas supply 106 is less than about 5 hours.

In the embodiments described herein, the temperature of the electrostatic chuck 110 may be rapidly changed by hot/cold cycling. Specifically, the hot abrasion state may be about 30 seconds in each of the hot/cold cycles. Similarly, the cold abrasion state may be about 30 seconds in each of the hot/cold cycles. In another embodiment, the output power of the radio frequency source 104 may be set to its maximum power level while the output pressure of the coolant gas supply 106 is set to its minimum pressure during the hot abrasion state. In a further embodiment, the output power of the radio frequency source may be set to its minimum power while the output pressure of the coolant gas supply 106 is at its maximum pressure during the cold abrasion state.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure. Similarly, although some aspects of the present disclosure are identified herein as preferred or particularly advantageous, it is contemplated that the present disclosure is not necessarily limited to these preferred aspects of the invention.

The embodiments described herein relate to methods for preparing an electrostatic chuck for use in a known recipe procedure, or maintaining an electrostatic chuck that is being used in a known recipe procedure. Thus, those practicing the embodiments described herein may readily modify the specific embodiments to comport to any recipe procedure.

Having described the invention in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present invention is not necessarily limited to these preferred aspects of the invention.

For the purposes of describing and defining the present disclosure it is noted that the terms "about" and "substantially" are utilized herein to represent the inherent degree of uncertainty that may be attributed to any quantitative comparison, value, measurement, or other representation. The terms "about" and "substantially" are also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method for stabilizing micro-topography of a ceramic contact surface of an electrostatic chuck, wherein the electrostatic chuck is disposed within a reaction chamber of a semiconductor wafer processing assembly comprising a radio frequency source and a coolant gas supply, the method comprising:
(A) clamping electrostatically a conditioning wafer to the ceramic contact surface of the electrostatic chuck;
(B) causing surface abrasion between a back side of the conditioning wafer and the ceramic contact surface by cycling an output power of the radio frequency source and an output pressure of the coolant gas supply such that the conditioning wafer expands and contracts once per cycle, each cycle comprising a hot abrasion state and a cold abrasion state;
wherein (i) in a hot abrasion state, the output power of the radio frequency source is relatively high and the output pressure of the coolant gas supply is relatively low to yield a relatively hot conditioning wafer; and (ii) in a cold abrasion state, the output power of the radio frequency source is relatively low and the output pressure of the coolant gas supply is relatively high to yield a relatively cool conditioning wafer;
(C) removing the conditioning wafer from the ceramic contact surface of the electrostatic chuck; and
(D) processing the electrostatic chuck with a waferless auto clean (WAC).

2. The method of claim 1 wherein the conditioning wafer comprises a deposited coating of silicon nitride.

3. The method of claim 1 wherein the electrostatic chuck is in a newly-manufactured state prior to the clamping of the conditioning wafer to the ceramic contact surface of the electrostatic chuck.

4. The method of claim 1 wherein the electrostatic chuck is in a production state prior to the clamping of the conditioning wafer to the ceramic contact surface of the electrostatic chuck.

5. The method of claim 1 further comprising:
clamping electrostatically an instrumented wafer to the ceramic contact surface of the electrostatic chuck;
measuring a seasoning temperature of the electrostatic chuck with the instrumented wafer; and
comparing a provided steady state wafer temperature to the measured seasoning temperature of the electrostatic chuck to establish a temperature delta.

6. The method of claim 5 wherein the seasoning temperature of the ceramic contact surface of the electrostatic chuck is measured with the instrumented wafer after about 150 to about 1000 of the hot/cold cycles of the output power of the radio frequency source and the output pressure of the coolant gas supply.

7. The method of claim 5 further comprising correlating the temperature delta to a micro-topography of the ceramic contact surface of the electrostatic chuck, wherein:
the micro-topography of the ceramic contact surface of the electrostatic chuck is at a steady state condition when the seasoning temperature of the electrostatic chuck is about the same as the steady state wafer temperature;
the micro-topography of the ceramic contact surface of the electrostatic chuck is relatively rough compared to the steady state condition when the seasoning temperature of the electrostatic chuck is greater than the steady state wafer temperature; and
the micro-topography of the ceramic contact surface of the electrostatic chuck is relatively smooth compared to the steady state condition when the steady state wafer temperature is greater than the seasoning temperature of the electrostatic chuck.

8. The method of claim 5 further comprising applying a recipe procedure to the instrumented wafer, wherein the seasoning temperature of the ceramic contact surface of the electrostatic chuck is measured with the instrumented wafer during the recipe procedure.

9. The method of claim 1, wherein the coolant gas supply supplies a thermally conductive gas sealed between a back side of the conditioning wafer and the ceramic contact surface of the electrostatic chuck, further comprising:
providing a maximum acceptable seepage-flow rate;
measuring a leakage rate of the thermally conductive gas from between the back side of the conditioning wafer and the ceramic contact surface of the electrostatic chuck; and
comparing the leakage rate to the maximum acceptable seepage-flow rate.

10. The method of claim 9 wherein when the leakage rate is greater than the maximum acceptable seepage-flow rate, the WAC is relatively mild compared to a recipe WAC.

11. The method of claim 1, wherein:
the WAC processing is relatively aggressive when an ion energy of the reaction chamber is relatively high compared to a recipe ion energy, an ion flux of the reaction chamber is relatively high compared to a recipe ion flux, an amount of reactive species is relatively high compared to a recipe amount of reactive species, or a combination thereof; and
the WAC processing is relatively mild when the ion energy of the reaction chamber is relatively low compared to the recipe ion energy, the ion flux of the reaction chamber is relatively low compared to the recipe ion flux, the amount of reactive species is relatively low compared to the recipe amount of reactive species, or a combination thereof.

12. The method of claim 1, wherein the WAC is about 90 seconds in duration for each of the hot/cold cycles of the output power of the radio frequency source and the output pressure of the coolant gas supply.

13. The method of claim 1, wherein a total duration of the WAC and all of the hot/cold cycles of the output power of the radio frequency source and the output pressure of the coolant gas supply is less than about 5 hours.

14. The method of claim 1 wherein the hot abrasion state is about 30 seconds in each of the hot/cold cycles of the output power of the radio frequency source and the output pressure of the coolant gas supply.

15. The method of claim 1 wherein the cold abrasion state is about 30 seconds in each of the hot/cold cycles of the output power of the radio frequency source and the output pressure of the coolant gas supply.

16. The method of claim 1 wherein at the hot abrasion state, the output power of the radio frequency source is at a maximum power for the radio frequency source and the output pressure of the coolant gas supply is at a minimum pressure for the coolant gas supply.

17. The method of claim 1 wherein at the cold abrasion state, the output power of the radio frequency source is at a minimum power for the radio frequency source and the output pressure of the coolant gas supply is at a maximum pressure for the coolant gas supply.

* * * * *